(12) United States Patent
Sun

(10) Patent No.: US 6,960,935 B1
(45) Date of Patent: Nov. 1, 2005

(54) METHOD AND APPARATUS FOR CASCADE PROGRAMMING A CHAIN OF CORES IN AN EMBEDDED ENVIRONMENT

(75) Inventor: Chung Sun, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 637 days.

(21) Appl. No.: 10/025,843

(22) Filed: Dec. 18, 2001

(51) Int. Cl.[7] .......................................... H03K 19/177
(52) U.S. Cl. ........................... 326/39; 326/38; 716/16; 716/17; 365/185.29; 365/218
(58) Field of Search ................... 326/38–40; 716/1–21

(56) References Cited

U.S. PATENT DOCUMENTS

| | | | |
|---|---|---|---|
| 5,477,165 A | 12/1995 | ElAyat et al. | 326/38 |
| 5,606,267 A | 2/1997 | El Ayat et al. | 326/41 |
| 5,698,992 A | 12/1997 | El Ayat et al. | 326/41 |
| 5,936,426 A | 8/1999 | Wilson et al. | 326/49 |
| 5,952,852 A | 9/1999 | McGowan et al. | 326/106 |
| 6,205,574 B1 * | 3/2001 | Dellinger et al. | 716/16 |
| 6,216,259 B1 * | 4/2001 | Guccione et al. | 716/17 |
| 6,334,208 B1 * | 12/2001 | Erickson | 716/17 |
| 6,462,577 B1 * | 10/2002 | Lee et al. | 326/40 |
| 6,571,382 B1 * | 5/2003 | Jacobson et al. | 716/16 |

OTHER PUBLICATIONS

"VariCore™ Embedded Programmable Gate Array Core (EPGA™) 0.18 μm Family" Release 2.0, Actel Corporation, pp. 1-16, Jun. 2001.

* cited by examiner

Primary Examiner—Vibol Tan
(74) Attorney, Agent, or Firm—Sierra Patent Group, Ltd.

(57) ABSTRACT

A system for clearing and programming the memory of an FPGA IC, when the IC is comprised of a plurality of cores. The system clears the memory of the of cores. The system then sequentially verifies completion of clearing memory of each core. The system then provides a programming ready signal to all cores when the memory of a last core has has been cleared. The system then sends the bitstream data to a first core. After the first core is programmed, the balance of the bitstream data is sent to a next core. This process is repeated until all of the cores are programmed.

20 Claims, 5 Drawing Sheets

METHOD AND APPARATUS FOR CASCADE PROGRAMMING A CHAIN OF CORES IN AN EMBEDDED ENVIRONMENT

BACKGROUND OF THE DISCLOSED SYSTEM

1. Field of the Invention

The present disclosed system relates to field-programmable gate arrays ("FPGA"), and more particularly, to a method and apparatus for cascade programming at least one programmable core on an FPGA Integrated Chip ("IC").

2. Description of the Related Art

An FPGA is an IC that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory ("PROM") table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M—M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device ("PLD"), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit ("ASIC") that has been designed and manufactured to perform that same specific function, the FPGA will necessarily be a larger device than the ASIC. This is because FPGAs are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC which makes the ASIC a smaller device. An ASIC, on the other hand, is not a flexible device. In other words, once an ASIC has been designed and manufactured it cannot be reconfigured to perform a different function like is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip ("SOC") that includes the embedded FPGA as well as several other components. The several other components may include, for example, a microprocessor, memory, arithmetic logic unit ("ALU"), state machine, etc. In this scenario the embedded FPGA may be only a small part of the whole SOC.

Whether an FPGA is to be manufactured as its own IC or embedded into a larger IC (e.g., an SOC), the intended application/use of the IC will determine the size and complexity of the FPGA that is needed. In some scenarios a large FPGA is needed, and in other scenarios a small FPGA is needed. Because conventional FPGAs are typically designed for their intended application/use, an FPGA designed to fulfill a need for a small FPGA must be substantially redesigned for use where a larger FPGA is needed.

In cases where multiple FPGAs are embedded in an IC, each of these FPGAs may be called a "core". Thus, a core is a reprogrammable embedded FPGA on an IC. The ability to have one or more cores in an IC can benefit an IC designer by saving design time, reducing design risk and helping the designer to gain or retain a competitive edge in a market.

One desirable feature when having cores on an IC is the ability to program all of the cores on an IC with a single bit-stream fed to the first core or leading core of the IC. This is advantageous to an end user because the end user need only interface with one core, rather than two or more of the cores.

BRIEF SUMMARY OF THE DISCLOSED SYSTEM

The present disclosed system provides a method and apparatus for clearing the memory of an FPGA IC, when the IC is comprised of a plurality of cores. The system comprises the acts of clearing the memory of the plurality of cores; sequentially verifying the completion of the acts of clearing memory for each core; and providing a programming ready signal to all cores when a last core has completed said clearing memory act.

The present disclosed system also provides a method and apparatus for sequentially programming with bitstream data each core of a plurality of cores in an FPGA IC, said method comprising: sending the bitstream data to a first core of the plurality of cores; sending the balance of the bitstream data to a next core of the plurality of cores after the first core has received its portion of bitstream data; repeating in a sequential manner the acts of sending a balance of the bitstream data to a following core of the plurality of cores after an immediately preceding core of has received its portion of bitstream data, until a last core of the plurality of cores has received its portion of bitstream data; and sending a program start signal to all cores, after a last core has received its portion of the bitstream data.

A better understanding of the features and advantages of the present disclosed system will be obtained by reference to the following detailed description of the disclosed system and accompanying drawings which set forth an illustrative embodiment in which the principles of the disclosed system are utilized.

DETAILED DESCRIPTION OF THE DISCLOSED SYSTEM

Figure 1:
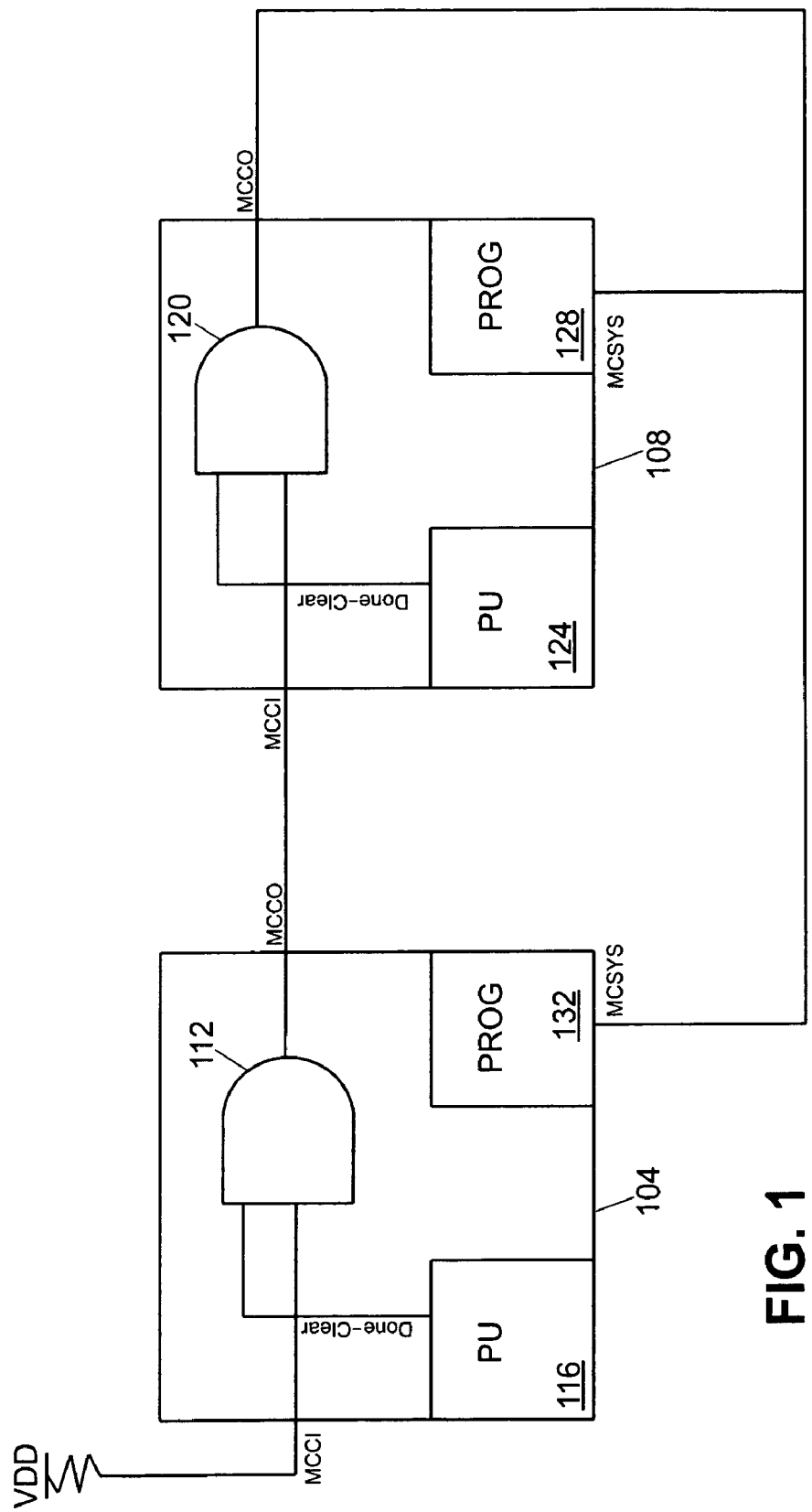
FIG. 1 is a simplified schematic of one embodiment of the disclosed system.

FIG. 1 shows a simplified schematic of the disclosed system. In FIG. 1, only the components for the "memory-clear" portion of the disclosed method are shown. FIG. 1 shows only two cores, the lead core 104 and the last core 108, however, in other embodiments of the disclosed system, there may be one or more additional cores between the lead core 104 and the last core 108. A memory cleared cascade signal ("MCCI") is shown coupled to a voltage source VDD. The MCCI may also be referred to as an "enable memory clear query signal." The first core 104 of the IC, also known as the "lead" core is coupled to the MCCI at an AND gate 112 in the first core. A power up module ("PU") 116 is shown coupled to a "DONE_CLEAR" signal. The DONE_CLEAR signal may also be referred to as a "memory cleared signal." The DONE-CLEAR signal is coupled to an input of the AND gate 112. The output of the AND gate 112 is coupled to the Memory Cleared Cascade Out signal ("MCCO"). The MCCO may also be referred to as a "memory cleared out signal." As shown in FIG. 1, the MCCO of the lead core 104 is coupled to the MCCI of the last core 108. In an other embodiment, with at least one intermediate core between the lead core and last core, the MCCO of the lead core may be coupled to the MCCI of the subsequent core, and the subsequent core's MCCO may be coupled the MCCI of the next core, and so on and so on, until the MCCO of the next to last core is coupled to the MCCI of the last core, thereby chaining together all the cores. Referring back to FIG. 1, the MCCI of the last core 108 is coupled to the input of an AND gate 120. A PU 124 is coupled to a DONE-CLEAR. The DONE-CLEAR is coupled to the input of the AND gate 120. The MCCO of the last core 108 is coupled to the Memory Clear System signal ("MCSYS") input of the last core 108. The MCSYS may also be referred to as a "programming ready signal." The MCSYS of the last core 108 is coupled to the Programming Module ("PROG") 128 of the last core 108. Also, the MCCO of the last core 108 is coupled to the MCSYS of the lead core 104. The MCSYS of the lead core 104 is coupled to the Programming Module ("PROG") 132 of the lead core. In an other embodiment of the disclosed system, there may be at least one intermediate core between the lead and last core. The MCCO of the last core may be coupled to each MCSYS of each at least one intermediate core between the lead and last cores, and the MCSYS of each at least one intermediate core may be coupled to a PROG on each of the at least one intermediate cores. In another embodiment of the system, there may be only one core, wherein the MCCO is coupled to the MCSYS of the one core.

Figure 2:
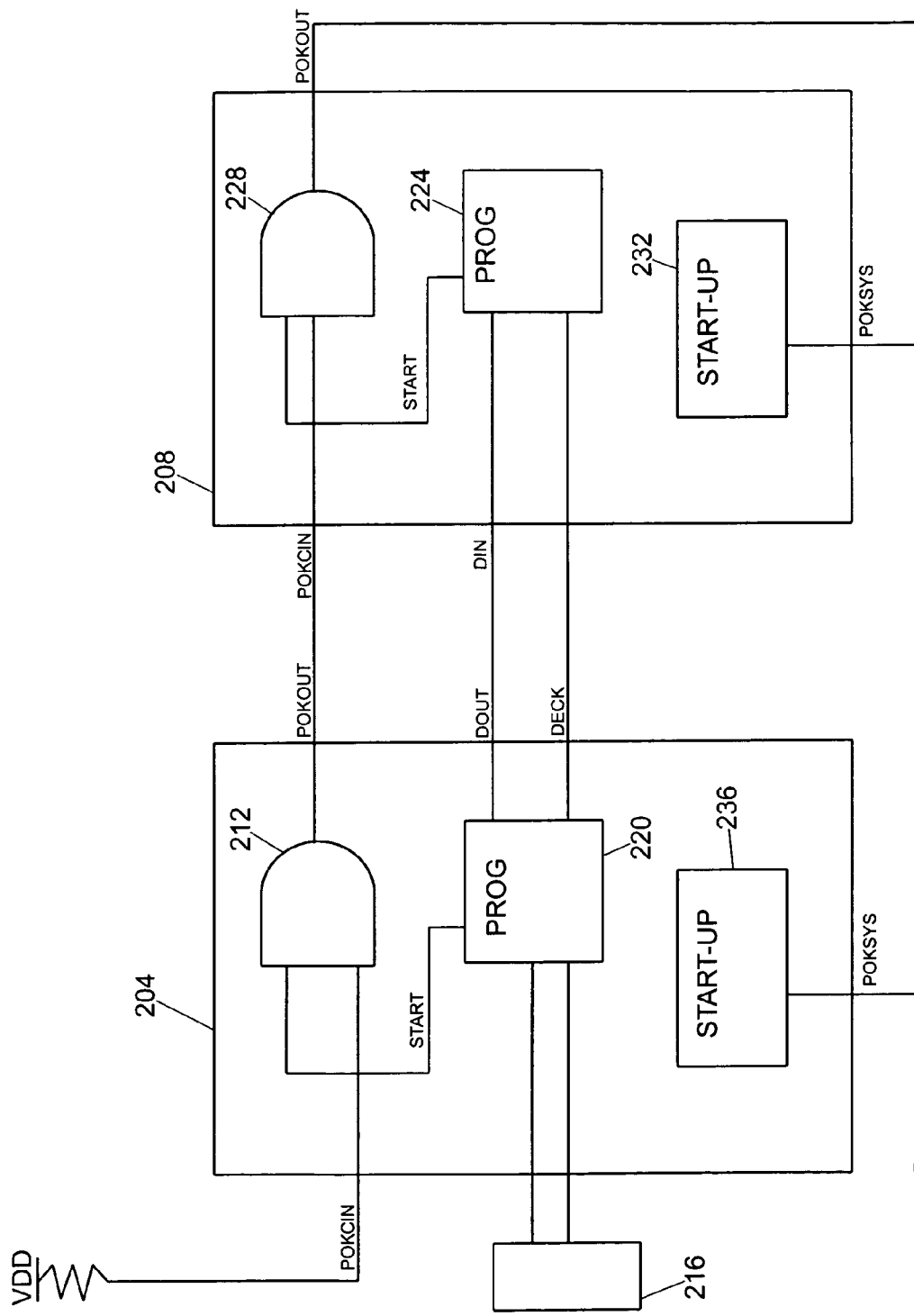
FIG. 2 is a simplified schematic of another embodiment of the disclosed system.

FIG. 2 is an other simplified schematic of the disclosed system. FIG. 2 shows the components necessary for a disclosed chain programming method. Once again a lead core 204 and a last core 208 are shown. However, as explained with FIG. 1, other embodiments may include at least one intermediate core between the lead and last cores. The lead core is coupled to a Program Okay Out signal ("POKCIN") which is coupled to a voltage supply VDD. The POKCIN may also be referred to as an "enable programming completed query signal." POKCIN couples to the lead core via the input of an AND gate 212. A bus interface 216 is coupled to a PROG 220 of the lead core 204. The bus interface supplies the cores with the bitstream program. The bus interface may be a serial interface or a parallel interface. The PROG 220 is coupled to a START signal. The START signal may also be referred to as a "core programmed signal." The START signal is coupled the other input of the AND gate 212. The output of the AND gate 212 is coupled to the lead core's PROGRAM OKAY OUT signal ("POKOUT"). The lead core's POKOUT is coupled to the subsequent core's POKCIN, in the case of FIG. 2, the subsequent core is the last core. In other embodiments, POKOUT of the lead core 204 may be coupled to the POKCIN of at least one intermediate core between the lead core and the last core of the IC, and the POKOUT of the at least one intermediate core may be coupled to the POKCIN of another at least one intermediate core, and so on and so on, thereby chaining together all the cores of the IC. The PROG 220 of the lead core is coupled to a DOUT signal. The DOUT may also be referred to as a data out signal. The DOUT signal may be either a serial data bypass to the next core for transmitting the bitstream program or a parallel data bypass to the next core. The DOUT is coupled to the DIN of the subsequent core, which is the last core 208 in FIG. 2. The DIN is coupled to the PROG of the subsequent core. The DIN may also be referred to as a data in signal.

Still referring to FIG. 2, the PROG 220 of the lead core is also coupled to a DATA FETCH CLOCK ("DFCK"). The DFCK may be used to fetch programming data from an external EPROM when the leading core is put in EPROM program mode. In another embodiment, the DFCK may be a replication of the programming clock, where the source of the programming clock can be either external or internal to the leading core. In case of EPROM program mode, the programming clock is internal to the leading device. Thus, the DFCK may always be a replication of the programming clock even when the core is not in EPROM program mode. Therefore DFCK can be used as the source of programming clock for the down-stream devices. The DFCK is also in sync with DOUT when bitstream programming data is passing through DOUT.

Referring again to FIG. 2, the DFCK of the lead core 204 is coupled to the PROG of the subsequent core, in this case the PROG 224 of the last core 208. The PROG of the last core and the PROGs of any at least one intermediate cores between the leading and last cores are coupled to a START signal, which in turn is coupled to an input of that core's AND gate.

The output of the last core's AND gate 228 is coupled to a POKOUT. However, the POKOUT of the last core is coupled to the PROGRAMMING OK SYSTEM signal ("POKSYS") of each core on the IC. The POKSYS may also be referred to as "run program signal." Referring to FIG. 2, the POKOUT of the last core 208 is coupled to the POKSYS of the last core. The last core POKSYS is coupled to the last core STARTUP module 232. Also, the last core POKOUT is coupled to the lead core's POKSYS. The lead core's POKSYS is coupled to the lead core's START-UP module 236. In other embodiments, there may be at least one intermediate core between the lead core and the last core. In those embodiments, the POKOUT of the last core is coupled to each POKSYS of the at least one intermediate core between the lead core and last core. Likewise, the POKSYS of each of the at least one intermediate core between the lead and last cores is coupled to a START-UP module of each of the at least one intermediate core between the lead and last cores. In this manner, all of the cores are chained together. In another embodiment, there may only be one core, wherein the one core's POKOUT is coupled to its POKSYS.

Figure 3:
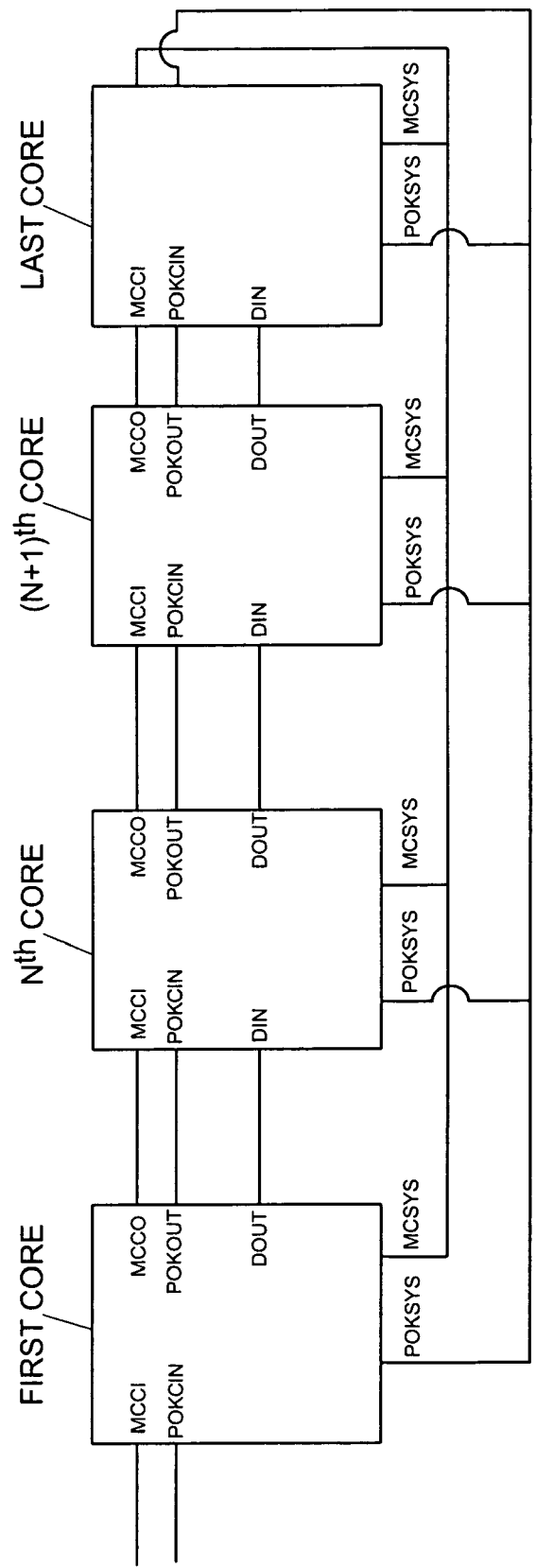
FIG. 3 is a simplified schematic of another embodiment of the disclosed system.

FIG. 3 is a simple schematic showing one embodiment of the disclosed system. A first core is shown coupled to an "Nth" core, the Nth core is coupled to a "(N+1)th" core, and the (N+1)th core is coupled to the last core. The variable "N" is used to indicate that variations of the number of cores may be used. For example: there may be only 2 cores, a first and a last core directly coupled to each other; 3 cores, with the first core coupled to a $2^{nd}$ core, and the $2^{nd}$ core coupled to the last core; 4 cores, with the $1^{st}$ core coupled to the $2^{nd}$ core, $2^{nd}$ core coupled to a $3^{rd}$ core, and $3^{rd}$ core coupled to the last core; 5 cores, with a 1st core coupled to a $2^{nd}$ core, $2^{nd}$ core coupled to a third core, $3^{rd}$ core coupled to a $4^{th}$ core and the $4^{th}$ core coupled to the last core; and so on and so forth; with 6, 7, 8 or more cores all coupled in a similar fashion. In another embodiment, there may only be one core, thus the MCCO of the one core is coupled to its own MCSYS, and the POKOUT of the one core is coupled to its own POKSYS. In this one core embodiment there may be no need for a DOUT or DIN.

Figure 4:
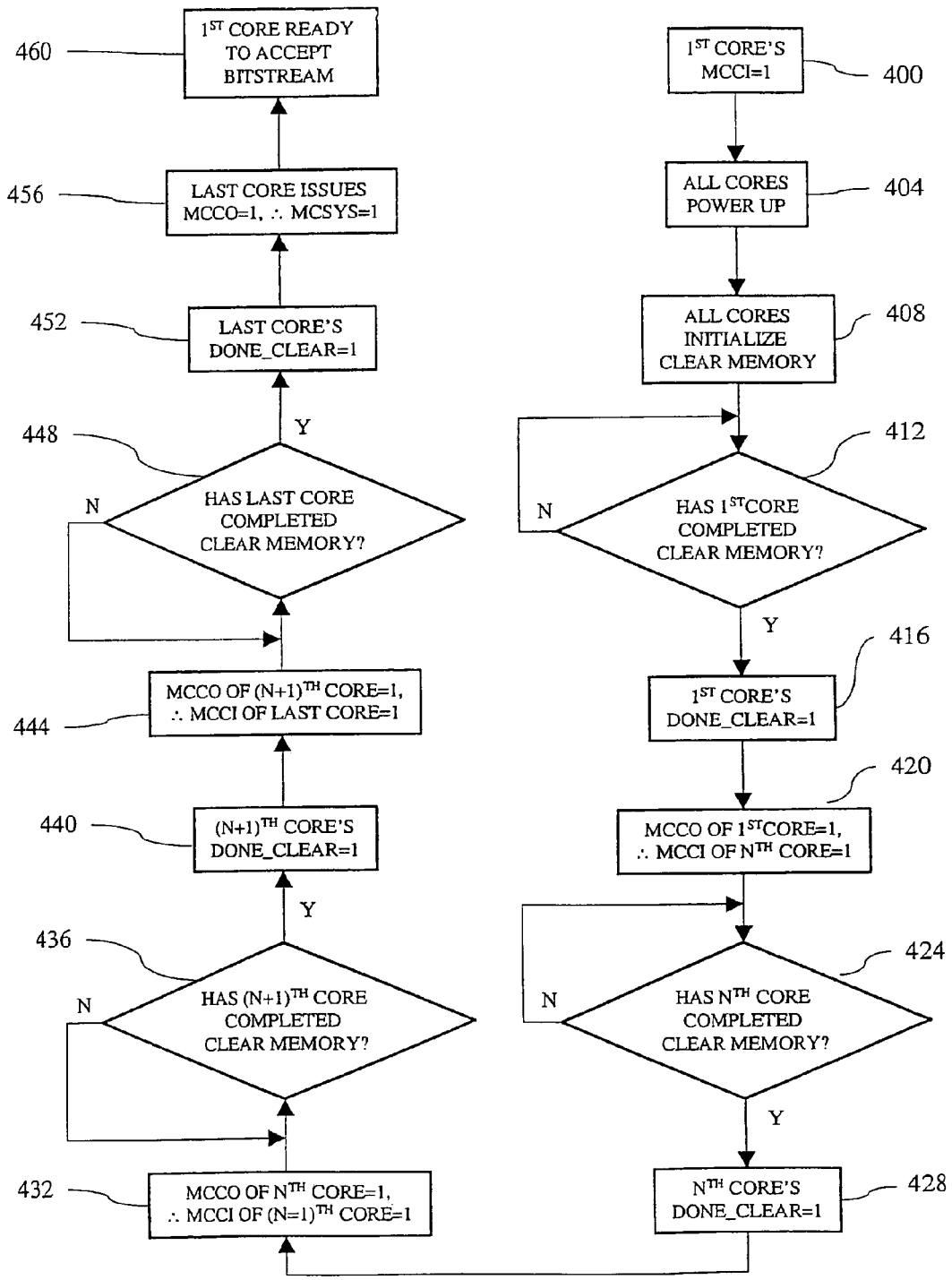
FIG. 4 is a flowchart illustrating one embodiment of the disclosed method.

FIG. 4 is a flowchart illustrating a disclosed method for clearing the configuration memory of each core. When the system powers up, the leading core's MCCI is set to a logical 1 at act 400. Heretofore, any references to a logical 1 or a logical 0 may be referred to as simply a 1 or a 0. Also, it is well established that although a logical one may be referred to in the disclosed system, the system can easily be configured such that a logical zero may be used instead of a logical 1. Further, if an AND gate is referred to in the disclosed system, the system can easily be reconfigured to use other combinations of logic gates and other components to achieve the same or similar goals. 1, it can easily be a Each core initializes a clear memory routine at act 408, which when finished and properly executed will clear the configuration memory of each core. The system determines whether the lead (also referred to as the $1^{st}$ core) core has completed the clear memory routine at query 412. When the first core's clear memory routine has completed, the first core's PU will transmit a DONE_CLEAR signal equal to 1 at act 416. The first core's DONE-CLEAR' s signal of 1 in association with the MCCI signal of 1, will drive the AND gate to provide a value of 1 at its output, thus driving a signal of 1 through the MCCO of the first core, which in turn is coupled to the MCCI of the next core, thereby driving a 1 signal into the MCCI of that next core, the Nth core, at act 420. At query 424 the system determines whether the next core, in this case the Nth core, has completed its clear memory routine. When the clear memory routine has been cleared, the Nth core's PU issues a DONE-CLEAR signal equal to 1 at act 428. The Nth core's DONE-CLEAR's signal of 1 in association with the Nth core's MCCI signal of 1, will drive the AND gate to provide a value of 1 at its output, thus driving a signal of 1 through the MCCO of the Nth core, which in turn is coupled to the MCCI of the (N+1)th core, thereby driving a 1 signal into the (N+1)th's MCCI at act 432. At query 436 the system determines whether the (N+1)th core has completed its clear memory routine. When the clear memory routine has been cleared, the (N+1)th core's PU issues a DONE-CLEAR signal equal to 1 at act 440. The (N+1)th core's DONE-CLEAR's signal of 1 in association with the (N+1)th core's MCCI signal of 1, will drive the AND gate to provide a value of 1 at its output, thus driving a signal of 1 through the MCCO of the (N+1)th core, which in turn is coupled to the MCCI of the next core, which in this case is the last core, thereby driving a 1 signal into the last core's MCCI at act 444. At query 448 the system determines whether the last core has completed its clear memory routine. When the clear memory routine has been cleared, the last core's PU issues a DONE-CLEAR signal equal to 1 at act 452. The last core's DONE-CLEAR's signal of 1 in association with the last core's MCCI signal of 1, will drive the AND gate to provide a value of 1 at its output, thus driving a signal of 1 through the MCCO of the last core, which in turn is coupled to the MCSYS inputs of each core of the IC, thus driving a 1 signal into each core's PROG module at act 456. At this point, each core is ready to accept its bitstream programming at act 460.

Figure 5:
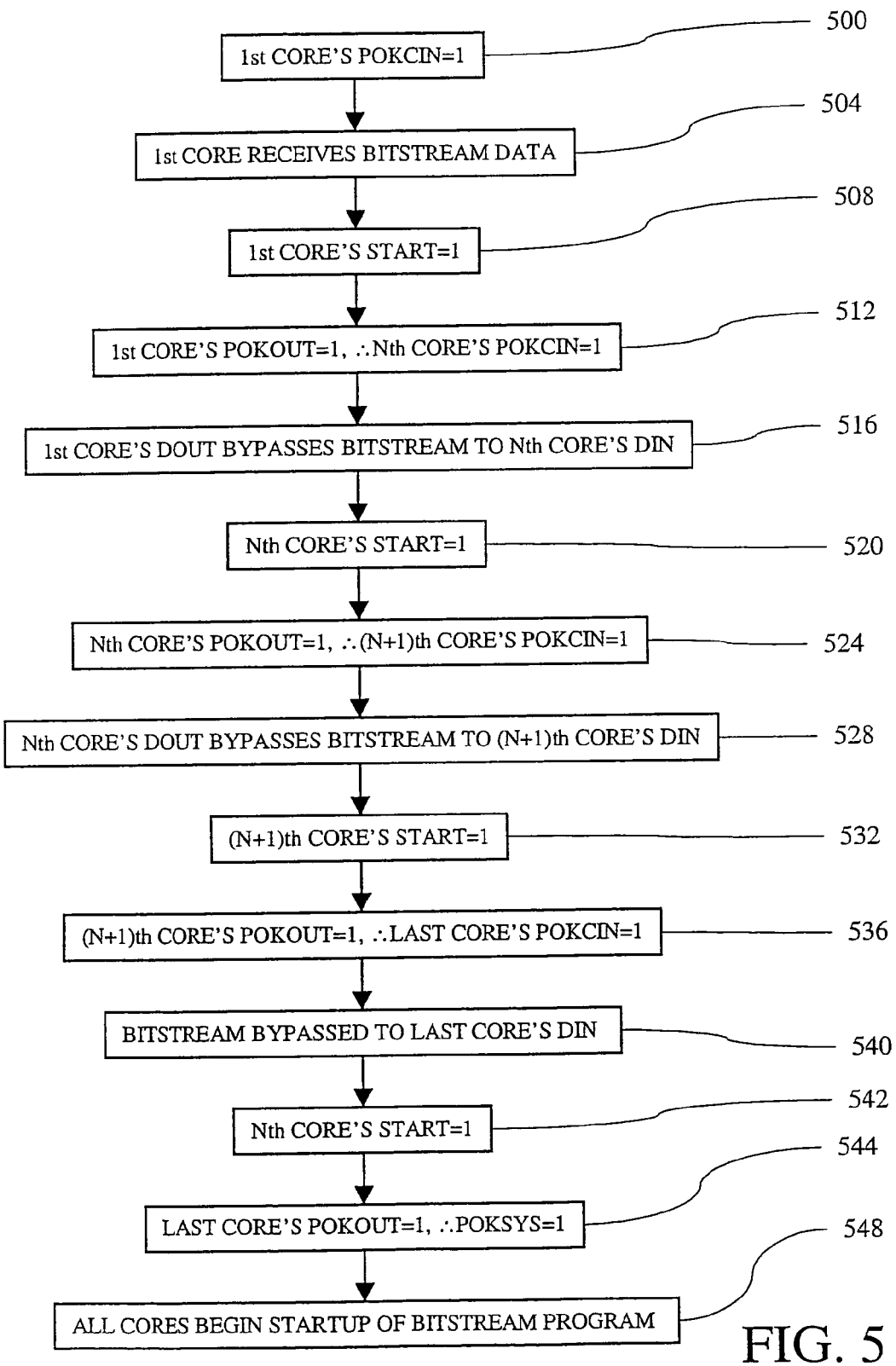
FIG. 5 is a flowchart illustrating one embodiment of the disclosed method.

Referring to FIG. 5, a flowchart is shown illustrating a disclosed method for programming multiple cores chained together. At start up the first core's POKCIN is set to 1 at act 500. At act 504 the first core's PROG receives its bitstream programming. The PROG is available to receive its bitstream programming because it has received a MCSYS input of 1 during a memory clear prior to programming (refer to FIG. 4, acts 456 and 460). Once the $1^{st}$ core's PROG has received its bitstream program, the PROG issues a start signal equal to 1 at act 508. The START signal of 1 and the POKCIN signal of 1 are coupled to the inputs of the $1^{st}$ core's AND gate, thus the output of the AND gate is 1. Therefore, at act 512, the $1^{st}$ core's POKOUT is equal to one, and since the $1^{st}$ core's POKOUT is coupled to the POKCIN of the Nth core, the Nth core's POKCIN is also equal to 1. After the $1^{st}$ core issues a start signal equal to 1, at act 516 the PROG of the $1^{st}$ core will bypass the remainder of the bitstream programming by transmitting it though its DOUT into the DIN of the Nth core. Once the Nth core's PROG has received its bitstream program, the PROG issues a START equal to 1 at act 520. The START signal of 1 and the POKCIN signal of 1 are coupled to the inputs of the Nth core's AND gate, thus the output of the AND gate is 1. Therefore, at act 524, the Nth core's POKOUT is equal to one, and since the Nth core's POKOUT is coupled to the POKCIN of the (N+1)th core, the (N+1)th core's POKCIN is also equal to 1. After the Nth core issues a START equal to 1, at act 528 the PROG of the Nth core will bypass the remainder of the bitstream programming by transmitting it through its DOUT into the DIN of the (N+1)th core. Once the (N+1)th core's PROG has received its bitstream program, the PROG issues a START equal to 1 at act 532. Since the START of 1 and the POKCIN of 1 are coupled to the inputs of the (N+1)th core's AND gate, the output of the AND gate is 1. Therefore, at act 536, the (N+1)th core's POKOUT is equal to one, and since the (N+1)th core's POKOUT is coupled to the POKCIN of the last core, the last core's POKCIN is also equal to 1. After the (N+1)th core issues a start signal equal to 1, at act 540 the PROG of the (N+1)th core will bypass the remainder of the bitstream programming by transmitting it out its DOUT into the DIN of the last core. Once the last core's PROG has received its bitstream program, the PROG issues a START signal equal to 1 at act 542. Since both the START and the POKCIN equals 1, and both are coupled to the inputs of the last core's AND gate, the output of the AND gate is 1. Therefore, at act 544, the last core's POKOUT is equal to one, and since the last core's POKOUT is coupled to the POKSYS of each of the cores, each of the cores POKSYS is now equal to 1. Once the START-UP module of each core receives the POKSYS signal of 1, each core begins the startup of its loaded bitstream program at act 548.

Any core which is not a last core of an IC, may be referred to as a non-last core. Similarly, any core which is not a first core of an IC may be referred to as a non-first core.

It should be understood that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A method for clearing the memory of a Field Programmable Gate Array ("FPGA") Integrated Chip ("IC"), comprised of a plurality of cores, said method comprising:
   clearing memory of said plurality of cores;
   sequentially verifying completion of said clearing memory act for each core of said plurality of cores;
   providing a programming ready signal to all cores of said plurality of cores when a last core of said plurality of cores has completed said clearing memory act;
   providing an enable memory clear query signal to a first core of said plurality of cores;
   clearing memory of said plurality of cores;
   determining whether said first core has completed its said clearing memory act;
   providing a first core memory cleared signal, if said first core has completed its said clearing memory act;
   providing a first core memory cleared out signal;
   repeating in a sequential manner the acts of determining whether a next core of said plurality of cores has completed its said clearing memory act, providing a said next core memory cleared signal, if said next core has completed its clearing memory act, and providing a said next core memory cleared out signal, until said last core has completed its clearing memory act;
   providing a said last core's memory cleared signal; and
   providing a said programming read signal to said all cores.

2. A method for sequentially programming with bitstream data each core of a plurality of cores in an FPGA IC, said method comprising:
   sending said bitstream data to a first core of said plurality of cores;
   sending the balance of said bitstream data to a next core of said plurality of cores after said first core has received its portion of bitstream data;
   repeating in a sequential manner the acts of sending a balance of said bitstream data to a following core of said plurality of cores after an immediately preceding core of said plurality of cores has received its portion of bitstream data, until a last core of said plurality of cores has received its portion of bitstream data; and
   sending a program start signal to all cores of said plurality of cores.

3. The method of claim 2 further comprising:
   providing to said first core an enable programming complete query signal;
   sending said bitstream data to said first core;
   providing a first core programmed signal, when said first core has received all its said bitstream data;
   providing a program ok out signal;
   sending the balance of said bitstream data from said first core to a next core of said plurality of cores;
   repeating the acts of providing a next core programmed signal, when said next core has received all its said bitstream data, providing a next core program ok out signal, sending the balance of said bitstream data from a said next core to a subsequent core of said plurality of cores, in a sequential manner until a last core of said plurality of cores has received its bitstream data;
   providing a said last core programmed signal; and
   providing a run program signal to said all cores.

4. An FPGA IC comprising:
   a plurality of cores, wherein each core comprises:
   an enable memory clear query signal coupled to an input of a first logic module;
   a power up module coupled to an input of said first logic module;
   a memory cleared out signal coupled to an output of said first logical module;
   a programming module coupled to a programming ready signal;

wherein the memory cleared out signal of each non-last core is coupled to the enable memory clear query signal of a subsequent core; and wherein the memory cleared out signal of a last core is coupled to said programming ready signal of each core.

5. The plurality of cores of claim 4, wherein each core further comprises:
   a program okay out signal coupled to a second logic module;
   a core programmed signal coupled to said programming module and to an input of said second logic module;
   a program okay out signal coupled to the output of said second logic module;
   a data out signal coupled to said programming module
   a data in signal coupled to each non-first core said programming module;
   a start up module coupled to a run program signal; and
   wherein each non-last core said program okay out signal is coupled to a subsequent core's enable programming complete query signal, wherein each non-first core data in signal is coupled to said data out signal of a preceding core; wherein a first core's programming module is coupled to a data bus interface, and wherein said program okay out signal of a last core is coupled to said run program signal of each core.

6. The IC of claim 5, wherein a data fetch clock signal couples each adjacent core's programming module.

7. The IC of claim 5 wherein the first and second logic units are AND gates.

8. The IC of claim 5, wherein the data bus interface is a serial interface.

9. The IC of claim 5, wherein the data bus interface is a parallel interface.

10. An FPGA IC comprised of a plurality of cores, said IC comprising:
    means for providing an enable memory clear query signal to a first core of said plurality of cores;
    means for clearing memory of said plurality of cores;
    means for determining whether said first core has completed its said clearing memory act;
    means for providing a first core memory cleared signal, if said first core has completed its said clearing memory act;
    means for providing a first core memory cleared out signal;
    means for repeating in a sequential manner the acts of determining whether a next core of said plurality of cores has completed its said clearing memory act, providing a said next core memory cleared signal, if said next core has completed its clearing memory act, and providing a said next core memory cleared out signal, until said last core has completed its clearing memory act;
    means for providing a said last core's memory cleared signal; and
    means for providing a said programming read signal to said all cores.

11. An FPGA IC with a plurality of cores, said IC comprising:
    means for providing to said first core an enable programming complete query signal;
    means for sending said bitstream data to said first core;
    means for providing a first core programmed signal, when said first core has received all its said bitstream data;
    means for providing a program ok out signal;
    means for sending the balance of said bitstream data from said first core to a next core of said plurality of cores;
    means for repeating the acts of providing a next core programmed signal, when said next core has received all its said bitstream data, providing a next core program ok out signal, sending the balance of said bitstream data from a said next core to a subsequent core of said plurality of cores, in a sequential manner until a last core of said plurality of cores has received its bitstream data;
    means for providing a said last core programmed signal; and
    means for providing a run program signal to said all cores.

12. A method for clearing the memory of an FPGA IC, comprised of one core, said method comprising:
    clearing memory of said core;
    verifying completion of said clearing memory act of said core;
    providing a programming ready signal to said core when said core has completed said clearing memory act;
    providing an enable memory clear query signal to said core;
    clearing memory of said core;
    determining whether said core has completed its said clearing memory act;
    providing a core memory cleared signal, if said core has completed its said clearing memory act;
    providing a core memory cleared out signal; and
    providing a said programming read signal to said core.

13. A method for programming with bitstream data a core in a FPGA IC, said method comprising:
    sending said bitstream data to said core;
    sending a program start signal to said core;
    providing to said core an enable programming complete query signal;
    sending said bitstream data to said core;
    providing a core programmed signal, when said core has received all its said bitstream data;
    providing a program ok out signal;
    providing a core programmed signal; and
    providing a run program signal to said core.

14. An FPGA IC comprising:
    a core, wherein said core comprises:
    an enable memory clear query signal coupled to an input of a first logic module;
    a power up module coupled to an input of said first logic module;
    a memory cleared out signal coupled to an output of said first logical module;
    a programming module coupled to a programming ready signal; and
    wherein the memory cleared out signal of said core is coupled to said programming ready signal of said core.

15. The core of claim 14, wherein said core further comprises:
    a program okay out signal coupled to a second logic module;
    a core programmed signal coupled to said programming module and to an input of said second logic module;
    a program okay out signal coupled to the output of said second logic module;
    a start up module coupled to a run program signal; and
    wherein said core's programming module is coupled to a data bus interface, and wherein said program okay out signal of said core is coupled to said run program signal of said core.

16. The IC of claim 15 wherein the first and second logic units are AND gates.

17. The IC of claim 15, wherein the data bus interface is a serial interface.

18. The IC of claim 15, wherein the data bus interface is a parallel interface.

19. An FPGA IC comprised of a core, said IC comprising:
means for providing an enable memory clear query signal to said core;
means for clearing memory of said core;
means for determining whether said core has completed its said clearing memory act;
means for providing a core memory cleared signal, if said core has completed its said clearing memory act;
means for providing a said core memory cleared out signal;
means for providing a said core memory cleared signal; and
means for providing a said core programming read signal.

20. An FPGA IC with a core, said IC comprising:
means for providing to said core an enable programming complete query signal;
means for sending said bitstream data to said core;
means for providing said core programmed signal, when said core has received all its said bitstream data;
means for providing a program ok out signal; and
means for providing a run program signal to said core.

* * * * *